United States Patent [19]

Nagata et al.

[11] Patent Number: 5,345,233
[45] Date of Patent: Sep. 6, 1994

[54] DIGITAL Σ-Δ MODULATOR

[75] Inventors: Mitsuru Nagata; Koichiro Sato, both of Yokohama; Tsunetaka Matsuo, Kawasaki, all of Japan

[73] Assignee: Kabushiki Kaisha Toshiba, Kawasaki, Japan

[21] Appl. No.: 40,035

[22] Filed: Mar. 30, 1993

[30] Foreign Application Priority Data

Mar. 30, 1992 [JP] Japan .................................. 4-073874

[51] Int. Cl.$^5$ .............................................. H03M 7/36
[52] U.S. Cl. ......................................... 341/76; 341/77
[58] Field of Search .................... 341/77, 76, 141, 143

[56] References Cited

U.S. PATENT DOCUMENTS 4,692,737  9/1987  Stikvoort et al. .

OTHER PUBLICATIONS

IEEE Journal Of Solid State Circuits, Jun. 1987, vol.-SC-22-No. 3, pp. 390-394, Peter J. A. Naus, et al., "A CMOS Stereo 16 Bit D/A Converter For Digital Audio."

IEEE Journal of Solid State Circuits, Aug. 1981, vol.-SC-16-No. 4, pp. 333-341, T. Misaw, et al., "Single-Chip Per Channel Codec With Filters . . . ".

Primary Examiner—Sharon D. Logan
Attorney, Agent, or Firm—Oblon, Spivak, McClelland, Maier & Neustadt

[57] ABSTRACT

A counter counts a clock signal. A multiplexer sequentially inputs digital input signals each having a plurality of bits in accordance with an output signal from the counter. A subtracter subtracts a quantized output signal delayed by an n-clock delay element from the input signal. An integrator integrates an output signal from the subtracter. The quantizer quantizes an output from the integrator. The n-clock delay element delays the output signal from the quantizer by n clocks and supplies the delayed signal to the subtracter. A demultiplexer sequentially outputs output signals from the quantizer in accordance with the output signal from the counter. This demultiplexer outputs signals in the input order of the multiplexer.

18 Claims, 11 Drawing Sheets

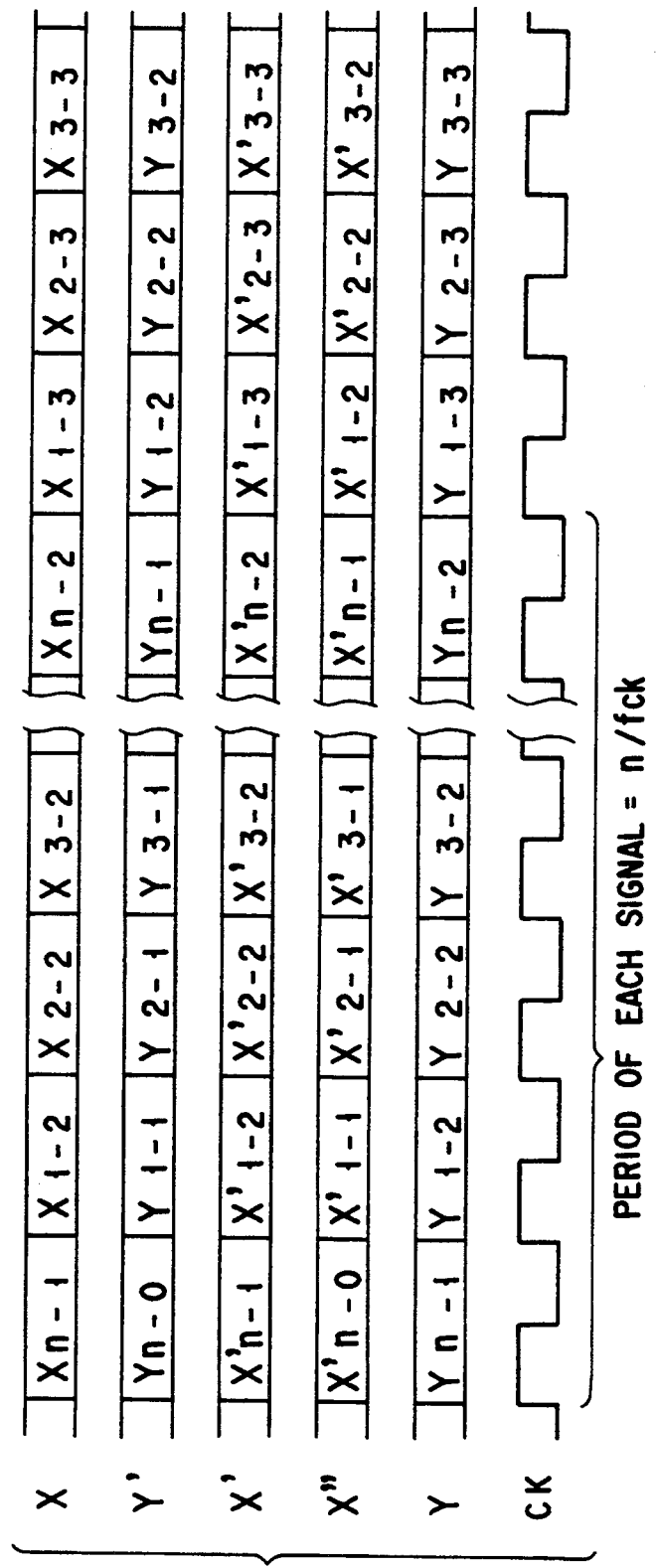
F I G. 5

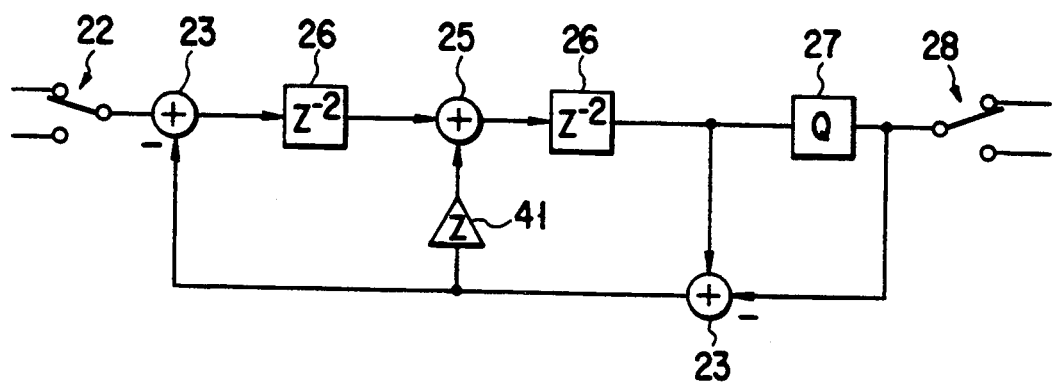
F I G. 8E

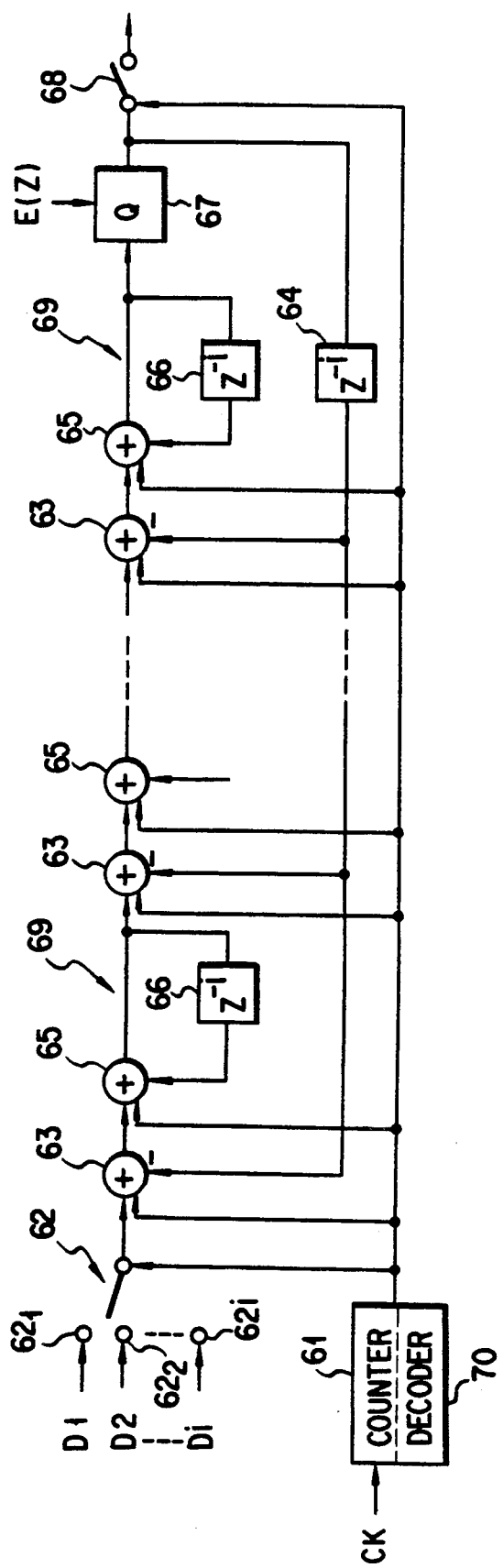
F I G. 10

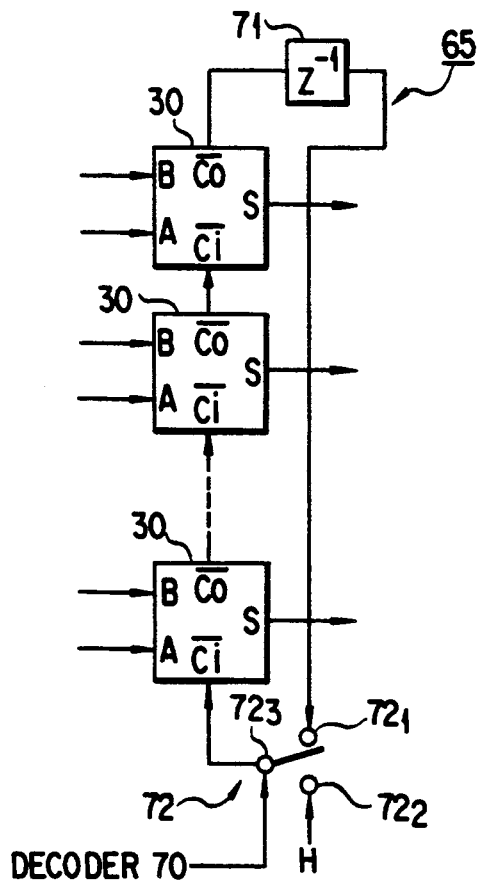
F I G. 11
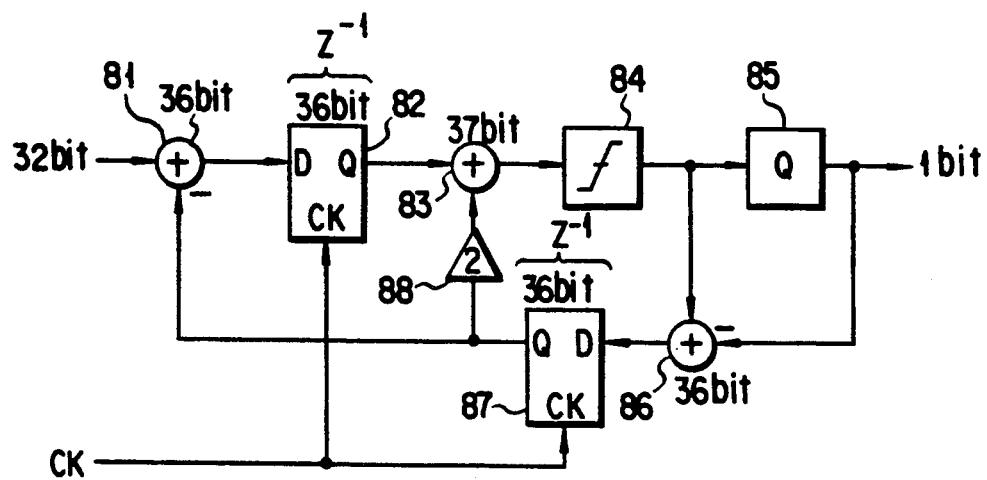
F I G. 12

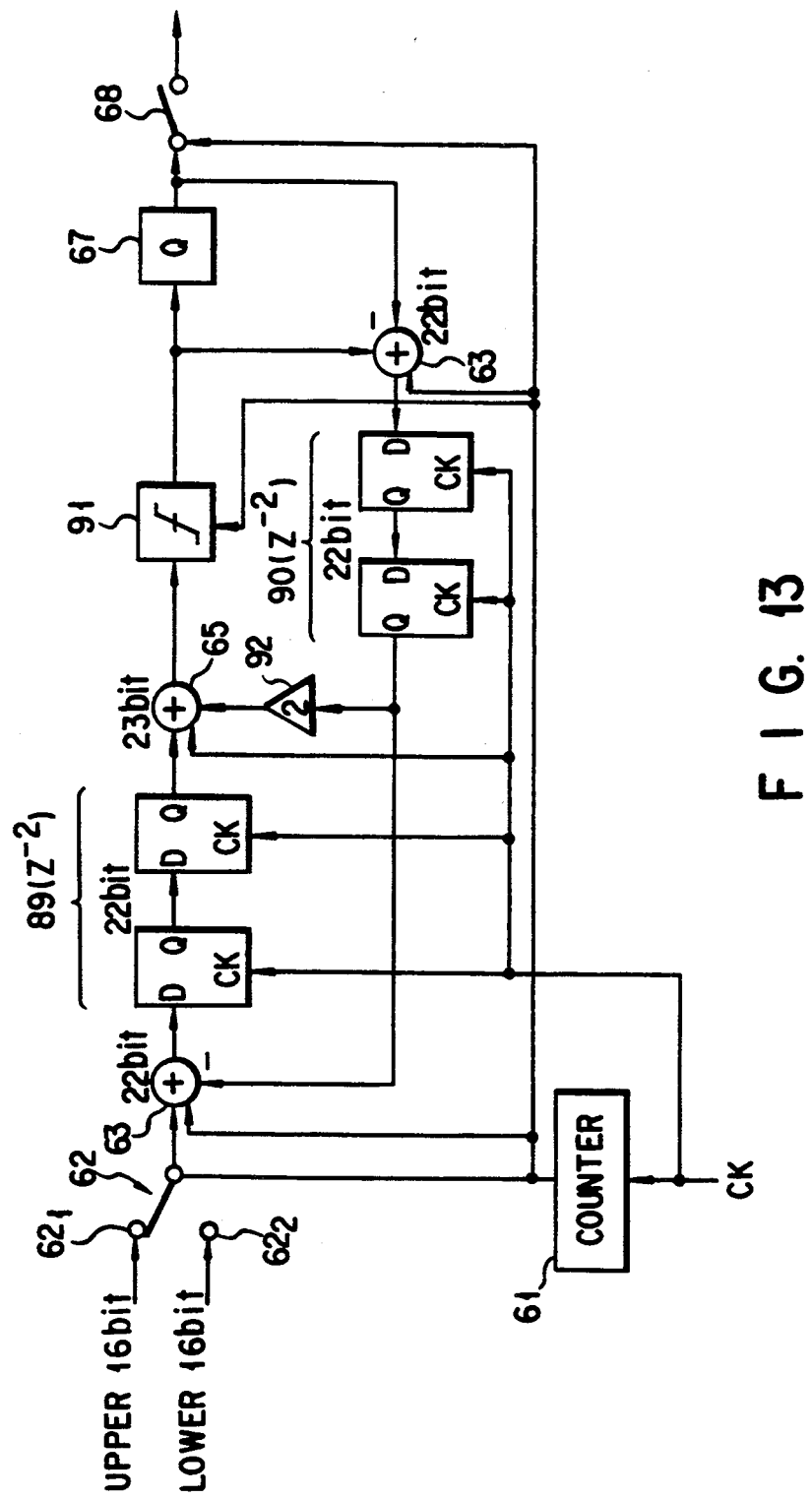
F I G. 13

DIGITAL Σ-Δ MODULATOR

BACKGROUND OF THE INVENTION

1. Field of the Invention

The present invention relates to a digital Σ-Δ modulator applied to, e.g., an audio circuit, and used in an oversampling type D/A converter for sampling an input signal by a signal having a frequency much higher than the input signal to obtain a high S/N (signal-to-noise ratio).

2. Description of the Related Art

As is well known, in converting and coding an analog signal into a digital signal, when the analog signal is sampled at a frequency twice as high as a signal frequency band $f_B$, the information of the original signal is not degraded in accordance with a Nyquist theorem. For this reason, a sampling frequency $f_S$ of a general D/A converter is set to about 2.2 to 2.4 times the signal frequency band $f_B$. To the contrary, an oversampling type D/A converter in which the sampling frequency $f_S$ is set much higher than the signal frequency band $f_B$ to improve conversion precision is developed and put into practice.

A maximum S/N value $S/N_{max}$ of a simple oversampling type D/A converter is as given below if the number of bits (resolution) is defined as n:

$$S/N_{max} = (3/2)2^{2n}(f_S/2f_B)$$

Judging from the above equation, when the resolution of the D/A converter is increased by one bit, the S/N ratio is increased by 6 dB. However, even if the sampling frequency is doubled, the S/N ratio is apparently increased by only 3 dB.

Various techniques for increasing the S/N ratio without greatly increasing the sampling frequency $f_S$ have been developed. One of the examples is a D/A converter using Σ-Δ modulation.

FIG. 15 shows a 1-bit D/A converter using a first-order Σ-Δ modulator. Referring to FIG. 10, reference numeral X(z) denotes a digital input signal; Y(z), a digital output signal; and E(z), a quantization error. X(z), Y(z), E(z) denote a z-transform. The digital input signal X(z) is supplied to one input terminal of a subtracter 11. An output from the subtracter 11 is input to an adder 13 constituting an integrator 12. The integrator 12 is constituted by the adder 13 and a one-clock delay circuit 14 having a one-clock delay time. An output from the integrator 12 is supplied to a quantizer 15 and is quantized thereby. The output signal Y(z) from the quantizer 15 is supplied to a D/A converter 16 and to the other input terminal of the subtracter 11 through a one-clock delay circuit 17. The following equation is established in this circuit:

$$Y(z) = X(z) + (1-z^{-1})E(z)$$

The quantization error E(z) generally has no correlation with the input signal X(z) and is assumed to have flat frequency characteristics. For this reason, the noise frequency characteristics of this system are given by:

$$(1-e^{j\omega T}) = j\omega T \text{ for } \omega T \ll 1$$

Where T is the period of the system clock signal. When the signal frequency band $f_B$ is set sufficiently lower than the sampling frequency $f_S$, the noise is proportional to the frequency. Therefore, the S/N ratio can be increased by 9 dB in the signal band every time the sampling frequency $f_S$ is doubled.

FIG. 16 shows an nth-order Σ-Δ modulator. In this nth-order Σ-Δ modulator, subtracters 11 and integrators 12 are connected in series with each other in n stages. An output signal from a quantizer 15 is supplied to the other input terminal of each subtracter 11 through a one-clock delay circuit 17.

This nth-order Σ-Δ modulator has transfer characteristics represented as follows:

$$Y(z) = X(z) + (1-z^{-1})^n E(z)$$

When this nth-order Σ-Δ modulator is used in a D/A converter, the S/N ratio can be increased by $3 \times (2n+1)$ dB in the signal band every time the sampling frequency $f_S$ is doubled.

In this manner, the oversampling D/A converter using the Σ-Δ modulator can increase the S/N ratio by increasing the sampling rate. For example, however, when a stereo signal is processed, D/A converters for two channels must generally be incorporated. For this reason, two Σ-Δ modulators are required. When this circuit is to be formed into an IC, a large number of circuit elements are required to increase the cost.

SUMMARY OF THE INVENTION

It is an object of the present invention to provide a multichannel digital Σ-Δ modulator capable of processing a multichannel signal and a multi-bit signal by using one Σ-Δ modulator to reduce the number of circuit elements, thereby reducing the cost in an oversampling type D/A converter.

In order to achieve the above object of the present invention, there is provided a digital Σ-Δ modulator comprising:

input means for sequentially receiving a digital signal of one channel from digital signals of n (n is an integer of not less than 2) channels in response to a clock signal, the digital signal having k (k is an integer of not less than 3) bits;

subtracting means, connected to said input means, for subtracting a feedback signal from the digital signal of one channel input from said input means;

integrating means, connected to said subtracting means, for integrating a signal output from said subtracting means;

quantizing means, connected to said integrating means, for quantizing a signal output from said integrating means into a quantized value j (j is an integer falling within a range of $1 < j < 2^K$) and generating an output signal;

delay means, connected to said quantizing means, for delaying the output signal from said quantizing means by n clocks and generating the feedback signal; and output means, connected to said quantizing means, for assigning the signal output from said quantizing means to n channels in accordance with the given order of the signals input by said input means, and outputting the signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a timing chart showing an operation of the modulator shown in FIG. 1;

FIGS. 8A to 8E are circuit diagrams showing a series of modifications of so as to obtain the modulator shown in FIG. 7 from that shown in FIG. 6;

FIG. 10 is a circuit diagram showing the third embodiment of the present invention;

FIG. 11 is a circuit diagram showing an arrangement of an adder shown in FIG. 10;

FIG. 12 is a circuit diagram showing a conventional $\Sigma$-$\Delta$ modulator;

FIG. 13 is a circuit diagram showing the fourth embodiment of the present invention;

DETAILED DESCRIPTION OF THE PREFERRED EMBODIMENTS

An embodiment of the present invention will be described with reference to the accompanying drawings.

Figure 1:
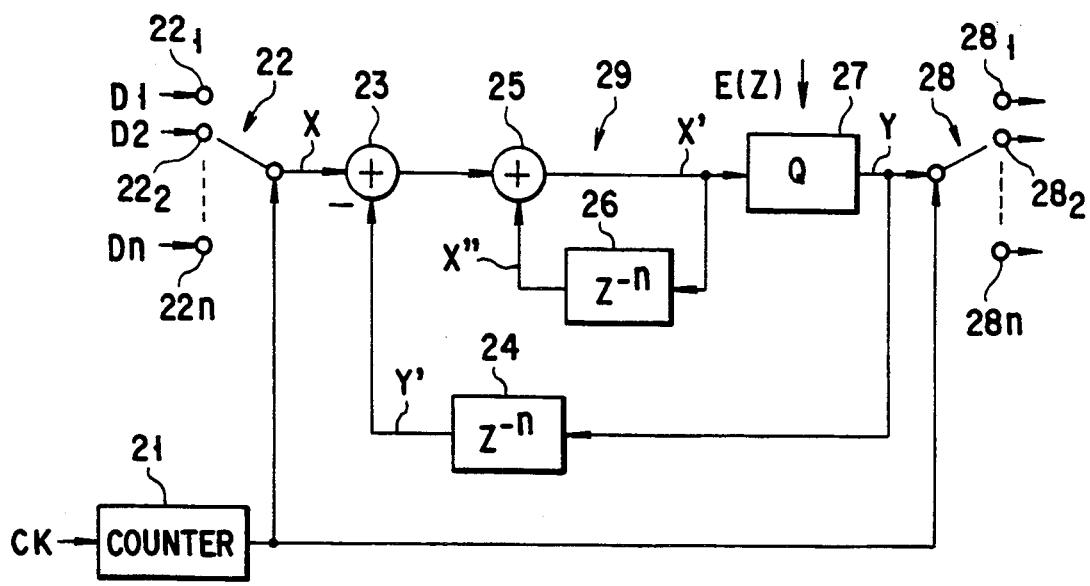
FIG. 1 is a circuit diagram showing an n-channel first-order $\Sigma$-$\Delta$ modulator according to the first embodiment of the present invention.

FIG. 1 shows an n-channel first-order $\Sigma$-$\Delta$ modulator. A mod.n counter 21 counts pulses of a clock signal CK. The output terminal of the counter 21 is connected to a multiplexer 22. The multiplexer 22 has input terminals $22_1$ to $22_n$ and sequentially receives a plurality of digital input signal bits D1 to Dn supplied from the input terminals $22_1$ to $22_n$. The output terminal of the multiplexer 22 is connected to one input terminal of a subtracter 23. The other input terminal of the subtracter 23 is connected to the output terminal of an n-clock delay element ($z^{-n}$) 24 having a delay time corresponding to n clocks. The output terminal of the subtracter 23 is connected to one input terminal of an adder 25. The other input terminal of the adder 25 is connected to the output terminal of an n-clock delay element 26. The output terminal of the adder 25 is connected to the input terminal of the n-clock delay element 26. The adder 25 and the n-clock delay element 26 constitute an integrator 29 for integrating an output from the subtracter 23. The output terminal of the adder 25 is connected to the input terminal of a quantizer (Q) 27. This quantizer 27 quantizes an integrated signal output from the adder 25 into a quantized value j where j is an integer falling within the range of $1 < j < 2^K$. The output terminal of the quantizer 27 is connected to the input terminal of the n-clock delay element 24 and the input terminal of a demultiplexer 28. The demultiplexer 28 has output terminals $28_1$ to $28_n$ and sequentially outputs the output signal from the quantizer 27 from the output terminals $28_1$ to $28_n$.

Figure 2:
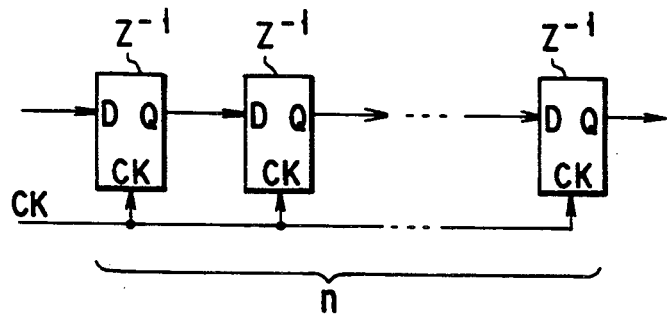
FIG. 2 is a circuit diagram showing an arrangement of an n-clock delay element.

FIG. 2 shows an arrangement of each of the n-clock delay elements 24 and 26. In this n-clock delay element, n one-clock delay circuits $z^{-1}$ each constituted by, e.g., a D flip-flop are connected in series with each other. The n-clock delay element delays the input signal by a delay time corresponding to n clocks in response to the clock signal CK. FIG. 2 shows the one-bit arrangement of each of the n-clock delay elements 24 and 26. The arrangements each shown in FIG. 2 are connected in parallel with each other in accordance with the bit count of the digital input signal in practice.

Figure 3:
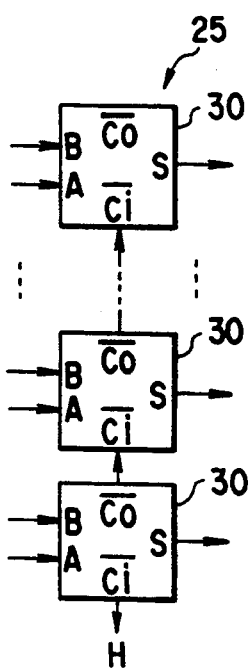
FIG. 3 is a circuit diagram showing an arrangement of an adder.
Figure 4:
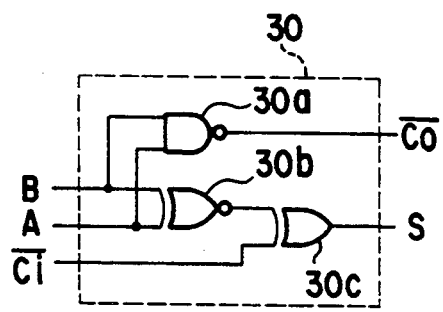
FIG. 4 is a circuit diagram showing an arrangement of a full adder shown in FIG. 3.

FIG. 3 shows the arrangement of the adder 25. This adder is obtained by series-connecting full adders 30 in accordance with the bit count of the digital input signal. Each full adder 30 comprises, e.g., a NAND gate 30a and exclusive NOR gates 30b and exclusive OR 30c, as shown in FIG. 4. The subtracter 23 has the same arrangement as that of the adder 25. Input signals used for a subtraction to be input to the subtracter 23 are converted into a twos complement. The number of full adders constituting the subtracter 23 is at least the number of bits of the input signals.

In the above arrangement, operation will be described with reference to FIG. 5.

The multiplexer 22 sequentially receives the digital input signal bits D1 to Dn supplied to the input terminals $22_1$ to $22_n$ in accordance with the output signal from the counter 21. The counter 21 is arranged such that when it receives the input signal bit Dn, it receives the input signal bit D1 again. This operation is repeated in accordance with the output signal from the counter 21.

The demultiplexer 28 is operated in synchronism with the multiplexer 22 in accordance with the output from the counter 21. That is, when the multiplexer 22 receives a signal i from the input terminal $22i$ (where i is an integer falling within the range of $1 \leq i \leq n$), the demultiplexer 28 also outputs the signal i from the output terminal $28i$.

At this time, the output from the n-clock delay element 24 is a quantized signal of the signal i of the immediately preceding period, i.e., immediately preceding n clocks. The output from integrator 29 constituted by the n-clock delay element 26 and the adder 25 is an integration result of the signal i of the immediately preceding period. Therefore, a signal output from this $\Sigma$-$\Delta$ modulator is identical to a signal obtained by inputting and processing the signal i every n clocks in the conventional one-channel $\Sigma$-$\Delta$ modulator.

The conventional one-channel $\Sigma$-$\Delta$ modulator can process a signal of each channel at a one-clock period. However, the n-channel $\Sigma$-$\Delta$ modulator according to the present invention can process the signal of each channel only at the n-clock period. In recent years, however, the LSI techniques have been remarkably developed, and the operation speed of LSIs is greatly increased. By increasing the speed of the system clock to n times, processing can be performed at the same speed as in the conventional technique. If the n value is not extremely increased, the operation speed rarely poses any problem.

Figure 6:
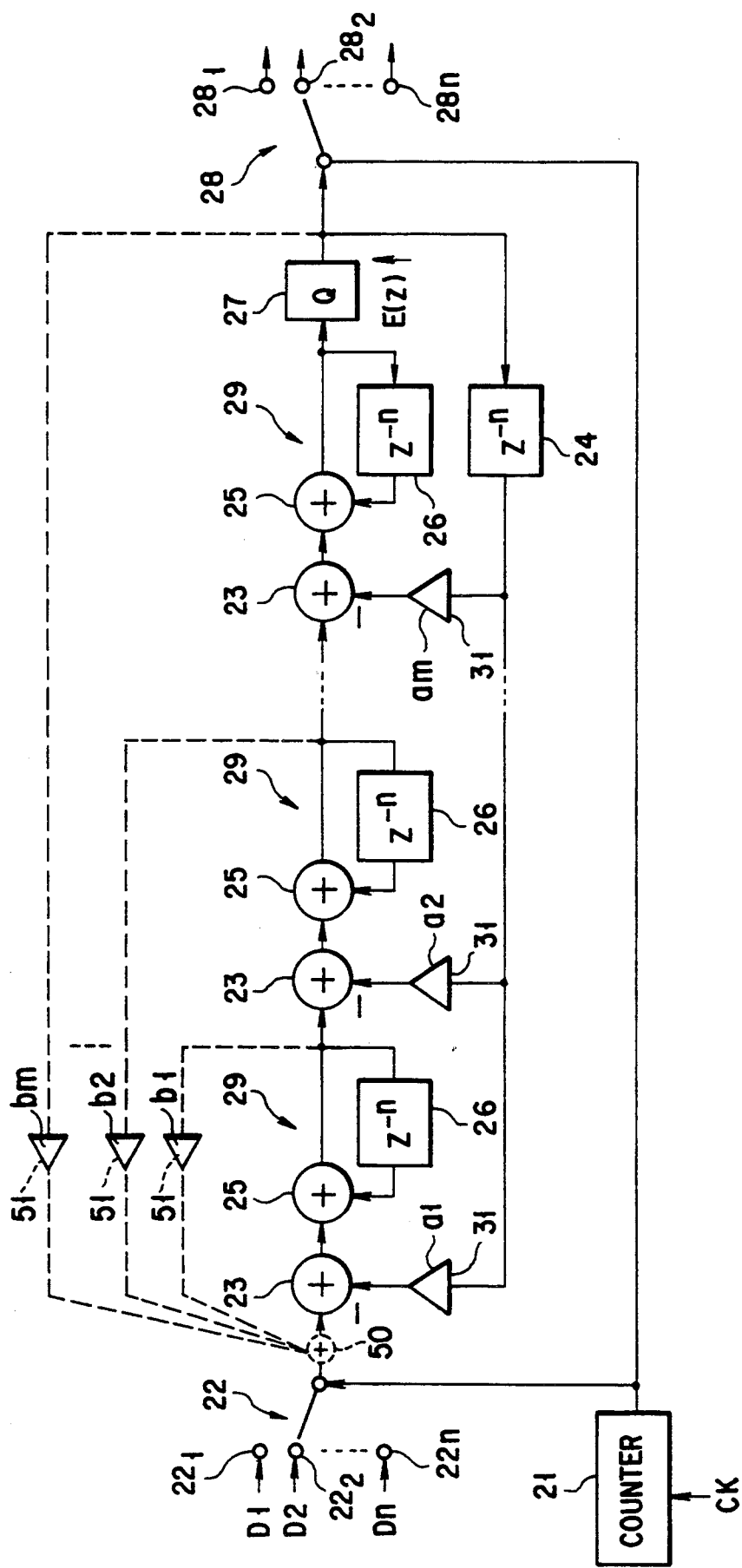
FIG. 6 is a circuit diagram of an n-channel mth-order $\Sigma$-$\Delta$ modulator according to the second embodiment of the present invention.

FIG. 6 shows the second embodiment of the present invention applied to an mth-order Σ-Δ modulator. In this case, m is an integer of 2 or more. The second embodiment has the same arrangement as that of FIG. 1 except that m integrators 29 are connected in series with each other. The same reference numerals as in FIG. 1 denote the same parts in FIG. 6. Referring to FIG. 6, a multiplier 31 is connected between an n-clock delay element ($z^{-n}$) 24 and each subtracter 23 to improve stability of the circuit operation. Coefficients a1, a2 to am of these multipliers 31 satisfy condition a1≦a2≦ .. . ≦am.

An adder 50 is connected between the multiplexer 22 and the subtracter 23. Multipliers 51 whose input terminals are connected to the output terminals of the integrator 29 and the output terminals of each multiplier 51 is connected to the adder 50. Coefficients b1 to bn are assigned to the multipliers 51, respectively. According to the structure the stability of the circuit operation can be increased. However, the adder 50 and multipliers 51 are not essential to the embodiment, and they may be omitted.

In this embodiment, n-channel signal processing can be performed at an n-clock period as in the first-order arrangement.

The number of circuit elements reduced by the present invention will be described in detail.

Figure 7:
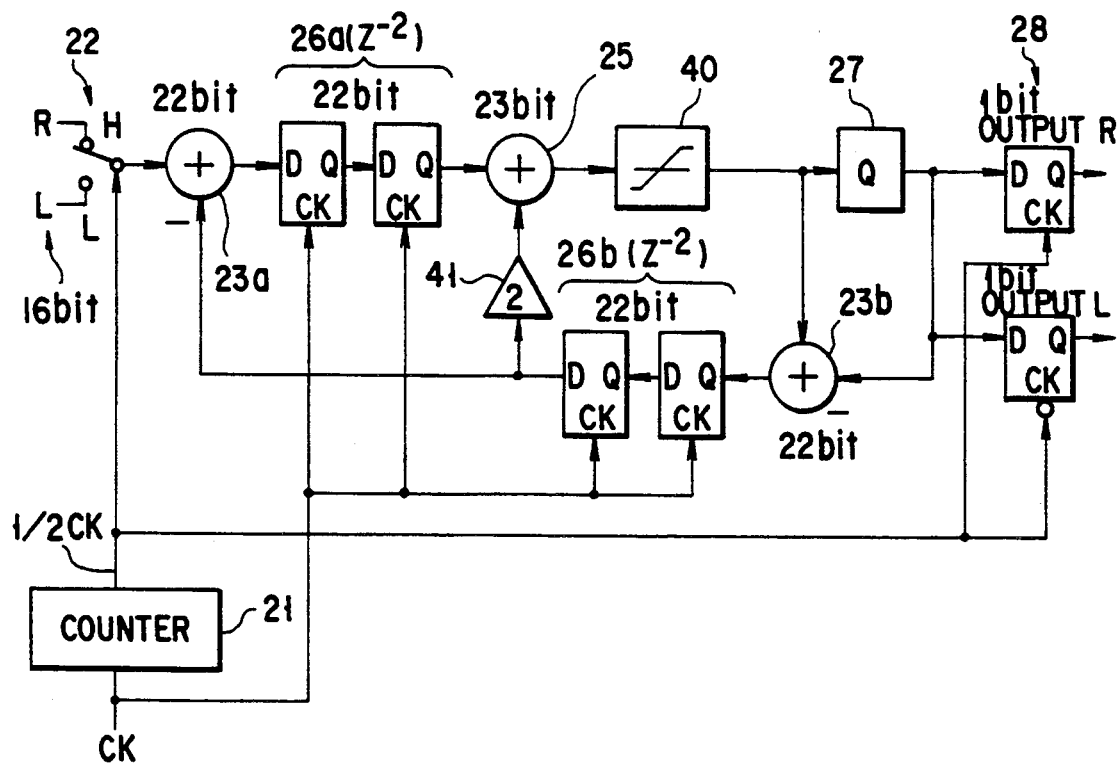
FIG. 7 is a circuit diagram showing a two-channel second-order $\Sigma$-$\Delta$ modulator according to the present invention.

FIG. 7 shows, e.g., a 2-channel Σ-Δ modulator using the present invention. This modulator is used to process, e.g., a stereo signal.

Stereo input signals R and L are 16-bit digital signals, respectively. These digital signals are sequentially input by a multiplexer 22 controlled by a counter 21. The multiplexer 22 is connected to a subtracter 23a. The subtracter 23a has a 22-bit arrangement. The subtracter 23a is connected to a 2-clock delay element ($z^{-2}$) 26a. The 2-clock delay element 26a is obtained by parallelly connecting two D flip-flops by 22 bits. The 2-clock delay element 26a is connected to an adder 25. The adder 25 has a 23-bit arrangement. A limiter 40 for limiting the number of bits of a signal is connected between the adder 25 and a quantizer 27. A demultiplexer 28 is constituted by two one-bit D flip-flops. These flip-flops are controlled by an output from the counter 21. A subtracter 23b is connected between the input and output terminals of the quantizer 27. The subtracter 23b has a 22-bit arrangement. The output terminal of the subtracter 23b is connected to a 2-clock delay element ($z^{-2}$) 26b. The 2-clock delay element 26b has the same arrangement as that of the 2-clock delay element 26a. A multiplier 41 is connected between the 2-clock delay element 26b and the adder 25. The multiplier 41 shifts the output signal from the 2-clock delay element 26b by one bit to double the output signal.

Figure 8A:
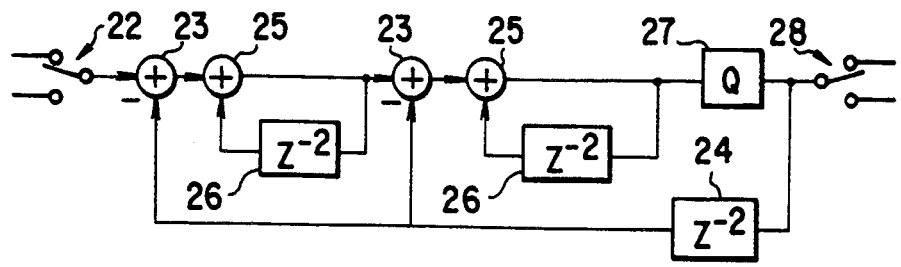
Figure 8B:
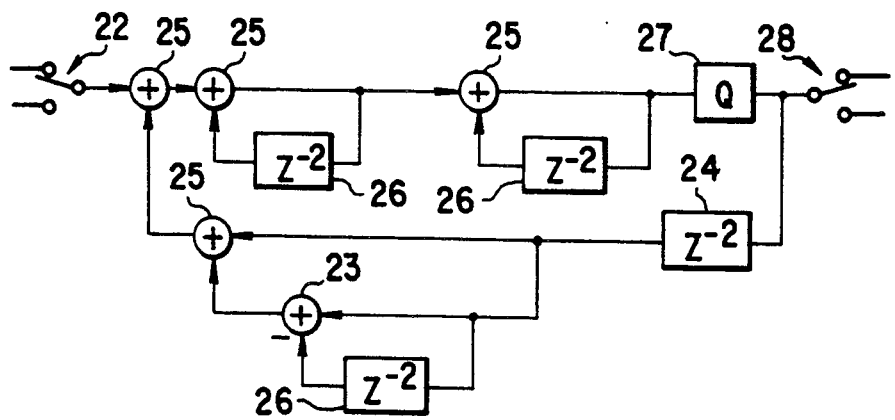
Figure 8C:
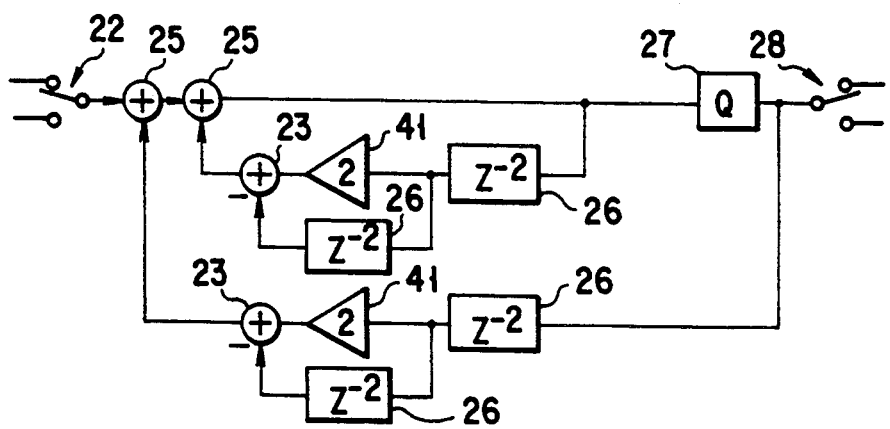
Figure 8D:
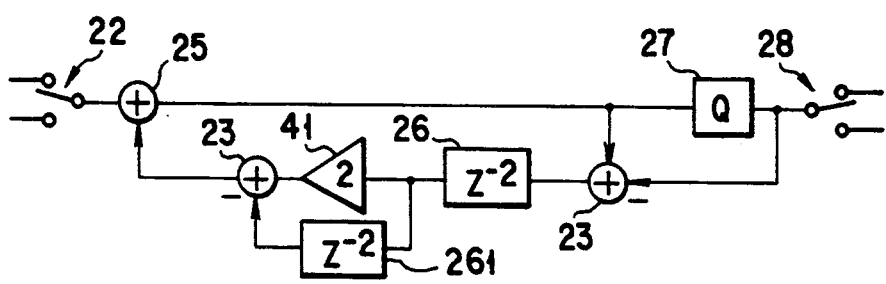

The 2-channel Σ-Δ modulator shown in FIG. 6 can be modified into modulator shown in FIG. 7. For m=2, n=2, b1=b2=0, and a1=a2=1, the modulator shown in FIG. 6 is modified into the 2-channel Σ-Δ modulator shown in FIG. 8A. Further, the modulator shown in FIG. 8A is sequentially modified into those shown in FIGS. 8A to 8E. The same reference numerals as in FIGS. 6 and 7 denote the same parts in FIGS. 8A to 8E. Referring to FIGS. 8A to 8E, the counter 21 shown in FIG. 7 is omitted. By modifying the modulator as described above, a 2-channel Σ-Δ modulator can be constituted by a smaller number of circuit elements. The circuits shown in FIGS. 8A to 8D can be represented by the following equation:

$$Y(z)=X(z)+(1-z^{-1})^2E(z)$$

The circuit shown in FIG. 6 and FIG. 8E is represented by the following equation:

$$Y(z)=X(z)(z^{-1})+(1-z^{-1})^2E(z)$$

In the circuit shown in FIG. 6, when a digital signal having a sampling frequency $f_S=44.1$ kHz is processed by Σ-Δ modulation in 192 oversampling, the clock signal CK has a frequency of $384f_S=16.9$ MHz, and a ½ clock signal has a frequency of 8.45 MHz. This frequency can be sufficiently used in a current CMOS.LSI. By using this Σ-Δ modulator, a high-performance one-bit D/A converter having an S/N ratio of 100 dB can be arranged.

Figures 9A, 9B:
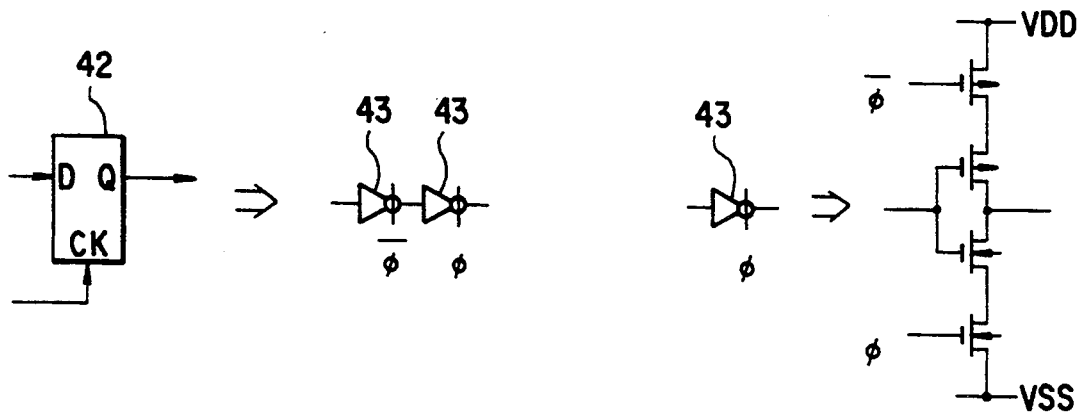
FIG. 9A is a circuit diagram showing an arrangement of a one-clock delay element using a clocked inverter shown in FIG. 7.
FIG. 9B is a circuit diagram showing a clocked inverter.

FIGS. 9A and 9B show a detailed arrangement of the D flip-flop used in FIG. 7. As shown in FIG. 9A, a D flip-flop 42 is a dynamic flip-flop in which two clocked inverters 43 are connected in series with each other. Each clocked inverter 43 is constituted by four MOS transistors, as shown in FIG. 9B. To arrange two clocked inverters, a total of eight MOS transistors are required.

The subtracters 23a and 23b and the adder 25 have the arrangements shown in FIGS. 3 and 4. The NAND gate 30a is constituted by four MOS transistors. Each of the exclusive NOR gates 30b and exclusive OR 30c is constituted by 10 MOS transistors. For this reason, a one-bit full adder requires a total of 24 MOS transistors. Each of the multiplexer 22 and the demultiplexer 28 requires eight MOS transistors per bit. The counter 21 constituted by one D flip-flop requires eight MOS transistors. Since the multiplier 41 performs a bit shift operation, MOS transistors need not be used. Since the limiter 40 can reduce the number of output bits with respect to the number of input bits by wiring, MOS transistors need not be used.

As can be apparent from the above description, the number of elements constituting the 2-channel Σ-Δ modulator shown in FIG. 7 is:

$$(8\times16)+(24\times22)+(8\times2\times22)+(24\times23)+(24\times2-2)+(8\times2\times22)+(8\times2)+8=2464$$

To the contrary, the number of elements required to arrange a two-channel configuration using two one-channel Σ-Δ modulators is:

$$(24\times22+8\times22+24\times23+24\times22+8\times22)\times2=3920$$

$$2464/3920=0.628$$

This one-channel Σ-Δ modulator is obtained such that the counter 21, the multiplexer 22, and the demultiplexer 28 are omitted and the two-clock delay circuits are replaced with one-clock delay circuits in the arrangement shown in FIG. 7.

The number of elements of the 2-channel $\Sigma$-$\Delta$ modulator employing the present invention can be found to be about 60% that of a two-channel configuration using two one-channel $\Sigma$-$\Delta$ modulators. The element count reduction ratio is conspicuous when the number of channels is increased.

FIG. 10 shows the third embodiment of the present invention. This embodiment exemplifies a one-channel mth-order digital $\Sigma$-$\Delta$ modulator. An n-bit (n is an integer of two or more) input signal supplied to this $\Sigma$-$\Delta$ modulator is divided into i (i is an integer of two or more; i<n) portions. For example, if n=32 bits and i=4, then divided input signals $D_1$ to $D_i$ are 8-bit signals, respectively.

A mod.n counter 61 counts clocks of a clock signal CK. The counter 61 is connected to a decoder 70 for decoding an output signal from the counter 61. The output terminal of the counter 61 is connected to a multiplexer 62. The multiplexer 62 has input terminals $62_1$ to $62_i$. The input terminals $62_1$ to $62_i$ respectively receive the input signals $D_1$ to $D_i$ which are divided into i portions and each of which consists of a plurality of bits. The multiplexer 62 sequentially inputs the input signals $D_1$ to $D_i$ supplied to the input terminals $62_1$ to $62_i$ from the LSB side (D1) to the MSB side (Di) in accordance with an output signal from the counter 61.

The output terminal of the multiplexer 62 is connected to a series circuit obtained by alternately arranging m subtracters 63 and m integrators 69. One input terminal of the first subtracter 63 is connected to the output terminal of the multiplexer 62. One input terminal of each subtracter 63 from the second subtracter is connected to the output terminal of the integrator 69 of the previous stage. The other input terminal of each subtracter 63 is connected to the output terminal of an i-clock delay element ($z^{-i}$) 64 for delaying an input signal by i clocks. Each integrator 69 is constituted by an adder 65 and an i-clock delay element 66. One input terminal of each adder 65 is connected to the output terminal of the subtracter 63 of the previous stage. The output terminal of each i-clock delay element 66 is connected to the other input terminal of the corresponding adder 65. Each subtracter 63 and each adder 65 receive an output signal from the decoder 70.

The output terminal of the mth adder 65 is connected to the input terminal of a quantizer (Q) 67. This quantizer 67 quantizes an integrated signal from the adder 65 into a quantized value j where j is an integer satisfying $1<j<2^K$. The output terminal of the quantizer 67 is connected to the input terminal of the i-clock delay element 64 and the input terminal of a switch 68. The switch 68 outputs the signal output from the quantizer 67 in accordance with the output from the decoder 70.

FIG. 11 shows an arrangement of the adder 65. The adder 65 has almost the same arrangement as that shown in FIG. 3. The same reference numerals as in FIG. 3 denote the same parts in FIG. 11. The adder 65 has a series circuit of n/i full adders 30. A carry output terminal/$C_0$ of the full adder 30 of the uppermost stage is connected to the input terminal of a one-clock delay element ($Z^{-1}$) 71. The output terminal of the one-clock delay element 71 is connected to one input terminal $72_1$ of a switch 72. The other input terminal $72_2$ of the switch 72 receives a high-level signal H, and an output terminal $72_3$ is connected to a carry input terminal/Ci of the full adder 30 of the lowermost stage. The switch 72 is controlled by an output signal from the decoder 70. That is, only when the switch 72 calculates an input signal including the LSB of the i divided input signals, the output terminal $72_3$ is connected to the other input terminal $72_2$. When other input signals are to be calculated, the output terminal $72_3$ is connected to one input terminal $72_1$. When the input signal including the LSB is to be calculated, a high-level signal is supplied to the carry input terminal/Ci of the full adder 30 of the lowermost stage. When other input signals are to be calculated, a signal held in the one-clock delay element 71 in the immediately preceding calculation is supplied to the carry input terminal/Ci of the full adder 30 of the lowermost stage.

The full adder 30 has the same arrangement as that shown in FIG. 4. The subtracter 63 also has the same arrangement as that of the adder 65. An input signal for subtraction is converted into a twos complement. Each of the i-clock delay elements 64 and 66 is constituted by i D flip-flops. The one-clock delay element 71 is constituted by one D flip-flop. Each of the i-clock delay elements 64 and 66 is constituted by parallel-connected flip-flops in accordance with the calculation bit count.

FIG. 12 shows a conventional $\Sigma$-$\Delta$ modulator for processing a 36-bit input signal. A subtracter 81 comprises a 36-bit subtracter, an adder 83 comprises a 37-bit adder, a subtracter 86 comprises a 36-bit subtracter, and one-clock delay elements 82 and 87 comprise 36-bit delay elements, respectively. The adder 83 and the subtracters 81 and 86 do not have one-clock delay elements for holding carry signals. A limiter 84 is arranged between the adder 83 and a quantizer 85. A multiplier 88 is connected between the one-clock delay element 87 and the adder 83. The multiplier 88 shifts an output signal from the one-clock delay element 87 by one bit to double the input signal.

FIG. 13 shows the fourth embodiment having the same function as that of the circuit shown in FIG. 12 according to the present invention. That is, the circuit in FIG. 13 is a $\Sigma$-$\Delta$ modulator obtained by modifying the circuit in FIG. 10. The same reference numerals as in FIG. 10 denote the same parts in FIG. 13. In this embodiment, a 36-bit input signal is divided into halves. An upper 16-bit input signal is supplied to an input terminal $62_1$ of a multiplexer 62. A lower 16-bit input signal is supplied to an input terminal $62_2$. Two subtracters 63 comprise 22-bit subtracters, an adder 65 comprises a 23-bit adder, and 2-clock delay elements 89 and 90 comprise 22-bit delay elements, respectively. A limiter 91 is connected between an adder 65 and a quantizer 67. A multiplier 92 is connected between the 2-clock delay element 90 and the adder 65. The multiplier 92 shifts an output signal from the 2-clock delay element 90 by one bit to double the input signal. In this embodiment, a decoder 70 is not connected to a counter 61. A switch 62 connected to the subtracter 63 and the adder 65 is controlled by an output signal from the counter 61. The limiter 91 is operated in accordance with the output signals from the counter 61 when the upper bits are calculated.

The number of circuit elements used in the circuit shown in FIG. 12 is obtained as follows in the same manner as described above:

(24×36)+(8×36)+(24×37)+(24×36)+(8×36)=3,192

To the contrary, the number of circuit elements used in the circuit shown in FIG. 13 is calculated as follows in the same manner as described above. Note that the switch is constituted by 8 transistors per bit, and the counter 61 is constituted by one D flip-flop circuit which requires eight transistors.

$$(24\times22+8+8)+(8\times22\times2)+(24\times23+8+8)+(24\times22+8+8)+(8\times22\times2)=2,360$$

The numbers of circuit elements in FIGS. 12 and 13 are compared with each other:

$$2,360/3,192=0.739$$

The number of circuit elements used in this embodiment can be reduced to about 74% as compared with the conventional case. The decrease in the number of circuit elements becomes conspicuous when the number of divisions of the input signal is increased. Since the number of circuit elements in this embodiment can be greatly reduced, a wiring area for connecting the circuit elements can be greatly reduced. A subtracter is taken as an example. 22 bits/36 bits=0.61. The wiring area can be reduced by 61% as compared with the conventional case.

Figure 14:
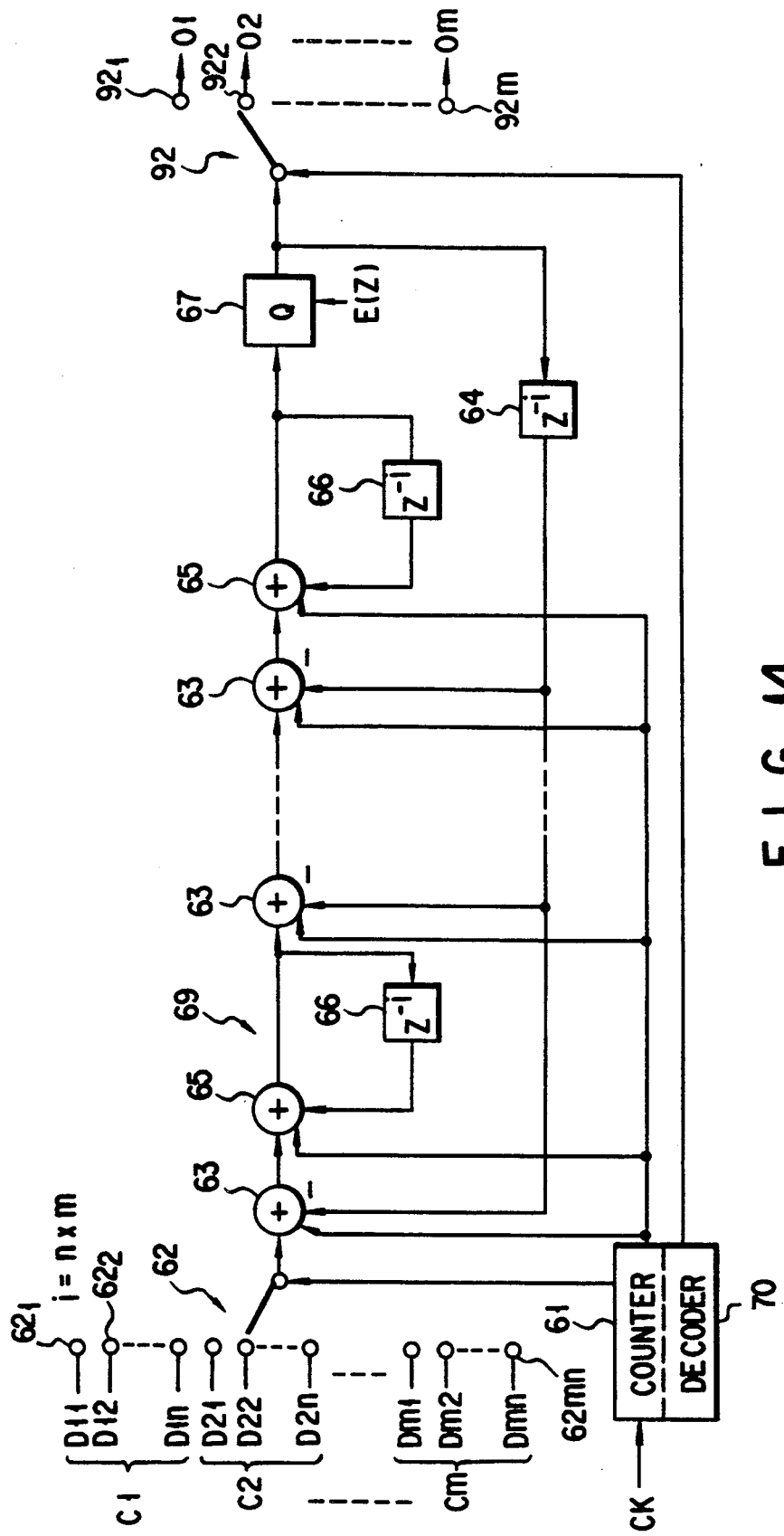
FIG. 14 is a circuit diagram showing the fifth embodiment of the present invention.
Figure 15:
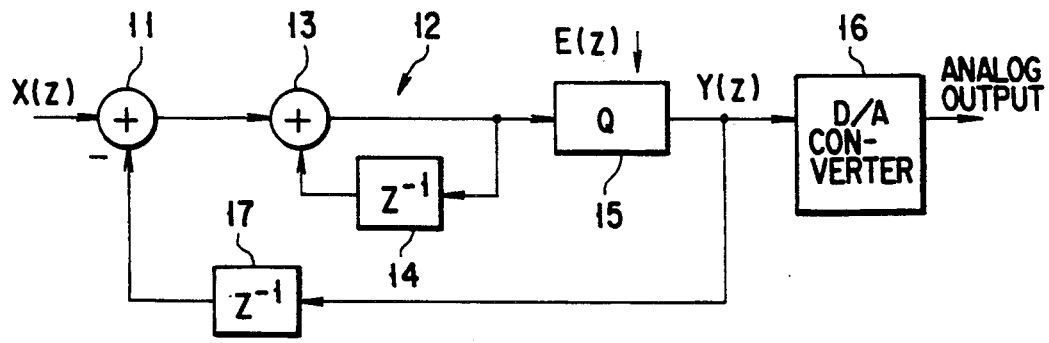
FIG. 15 is a circuit diagram showing an arrangement of a conventional one-channel first-order $\Sigma$-$\Delta$ modulator.
Figure 16:
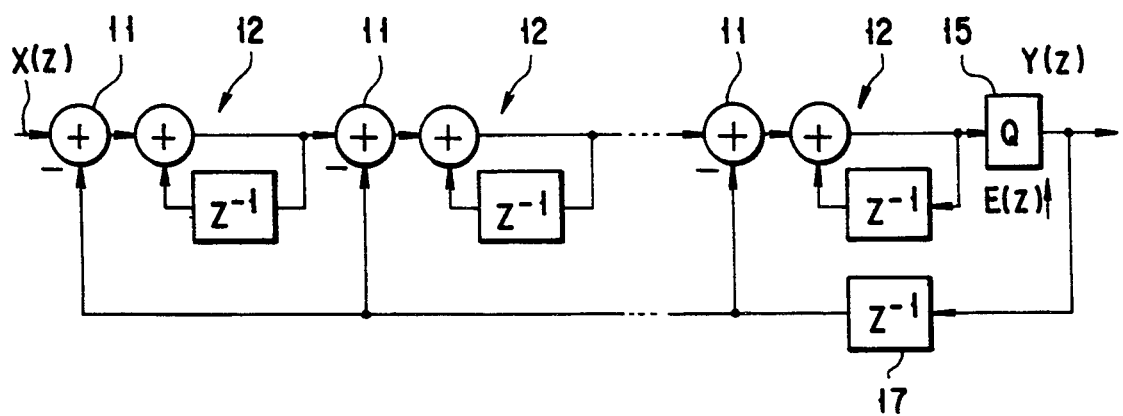
FIG. 16 is a circuit diagram showing an arrangement of a conventional one-channel mth-order $\Sigma$-$\Delta$ modulator.

FIG. 14 shows the fifth embodiment of the present invention. The same reference numerals as in FIG. 10 denote the same parts in FIG. 14. In the fifth embodiment, m-channel input signals C1, C2, ..., Cm are divided into n input signals D11, D12, ..., D1n, D21, D22, ..., D2n, ..., Dm1, Dm2, ..., Dmn. The divided input signals D11, D12, ..., Dmn are input to input terminals $62_{11}$, $62_{12}$, ..., $62_{mn}$ of a multiplexer 62, respectively. The multiplexer 62 sequentially selects the input terminals $62_{11}$, $62_{12}$, ..., $62_{mn}$ in accordance with output signals from the counter 61. The input signal of each channel is sequentially input from the LSB side to the MSB side. Each subtracter 63 or each adder 65 has a plurality of full adders, the number of which is required for the calculation, and i-clock delay elements 64 and 66 delay input signals by i clocks in response to the clock signal. In this case, $i=n\times m$. A demultiplexer 92 has output terminals $92_1$, $92_2$, ..., $92_m$. The demultiplexer 92 sequentially selects the output terminals $92_1$, $92_2$, ..., $92_m$ in accordance with output signals form the decoder 70 and outputs output signals $O_1$, $O_2$, ..., $O_m$ so as to correspond to the respective channels.

According to this embodiment, the number of circuit elements and the wiring area can be reduced to perform multichannel, multibit signal processing.

The present invention is not limited to the particular embodiments described above. For example, the arrangements of the n-clock delay element, the adder, the multiplexer, and the demultiplexer are not limited to the ones described above, but can be replaced with other circuit arrangements if they have identical functions.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A digital Σ-Δ modulator comprising:
    input means for sequentially receiving a digital signal of one channel from digital signals of n (n is an integer of not less than 2) channels in response to a clock signal, the digital signal having k (k is an integer of not less than 3) bits;
    subtracting means, connected to said input means, for subtracting a feedback signal from the digital signal of one channel input from said input means;
    integrating means, connected to said subtracting means, for integrating a signal output from said subtracting means;
    quantizing means, connected to said integrating means, for quantizing a signal output from said integrating means into a quantized value j (j is an integer falling within a range of $1<j<2^K$) and generating an output signal;
    delay means, connected to said quantizing means, for delaying the output signal from said quantizing means by n clocks and generating the feedback signal; and
    output means, connected to said quantizing means, for assigning the signal output from said quantizing means to n channels in accordance with the given order of the signals input by said input means, and outputting the signal.

2. The modulator according to claim 1, further comprising counting means for counting the clock signal and outputting a signal every time said counting means counts n clocks of the clock signal.

3. The modulator according to claim 1, wherein said integrating means comprises:
    adding means, connected to said subtracting means, for adding the signal output from said subtracting means and a delayed feedback signal; and
    delay means, connected to said adding means, for delaying a signal output from said adding means by n clocks and outputting the delayed feedback signal.

4. The modulator according to claim 1, wherein said subtracting means is constituted by at least k full adders.

5. A digital Σ-Δ modulator comprising:
    input means for sequentially receiving a digital signal of one channel from digital signals of n (n is an integer of not less than 2) channels in response to a clock signal, the digital signal having k (k is an integer of not less than 3) bits;
    m subtracting means each for subtracting a feedback signal from the digital signal of one channel input from said input means;
    m integrating means, connected to said m subtracting means, for integrating signals output from said m subtracting means, respectively;
    quantizing means, connected to said mth integrating means, for quantizing a signal output from said integrating means into a quantized value j (j is an integer falling within a range of $1<j<2^K$) and generating an output signal;
    delay means, connected to said quantizing means, for delaying the output signal from said quantizing means by n clocks and generating the feedback signal; and
    output means, connected to said quantizing means, for assigning the signal output from said quantizing means to n channels in accordance with the given order of the signals input by said input means, and outputting the signal.

6. The modulator according to claim 5, further comprising counting means for counting the clock signal and outputting a signal every time said counting means counts n clocks of the clock signal.

7. The modulator according to claim 5, further comprising multiplying means, connected to said m subtracting means and said delay means, for multiplying the feedback signal output from said delay means with a coefficient.

8. The modulator according to claim 5, wherein said subtracting means is constituted by at least k full adders.

9. The modulator according to claim 5, wherein said integrating means comprises:
adding means, connected to said subtracting means, for adding the signal output from said subtracting means and a delayed feedback signal; and
delay means, connected to said adding means, for delaying a signal output from said adding means by n clocks and outputting the delayed feedback signal.

10. A digital $\Sigma$-$\Delta$ modulator comprising:
input means for sequentially receiving digital signals of two channels in units of channels;
first subtracting means, connected to said input means, for subtracting a feedback signal from the signal of one channel input by said input means;
first delay means, connected to said first subtracting means, for delaying a signal output from said first subtracting means;
adding means, connected to said first delay means, for adding the feedback signal to a signal output from said first delay means;
quantizing means, connected to said adding means, for quantizing a signal output from said adding means;
second subtracting means, connected to said adding means and said quantizing means, for subtracting a signal output from said quantizing means from a signal output from said adding means;
second delay means, connected to said second subtracting means, for delaying a signal output from said second subtracting means and outputting the feedback signal; and
output means, connected to said quantizing means, for, assigning the output from said quantizing means to 2 channels in accordance with an input order in said input means.

11. The modulator according to claim 10, further comprising counting means for counting the clock signal and outputting a signal every time said counting means counts 2 clocks of the clock signal.

12. The modulator according to claim 10, further comprising multiplying means, connected between said adding means and said second delay means, for doubling the signal output from said second delay means.

13. The modulator according to claim 10, further comprising limiting means, connected between said adding means and said quantizing means, for limiting the number of bits of the signal output from said adding means.

14. The modulator according to claim 10, wherein said first and second delay means and said output means are constituted by D flip-flops.

15. A digital $\Sigma$-$\Delta$ modulator comprising:
input means for dividing an n-bit (n is an integer of not less than 2) digital signal into i (i is an integer of not less than 2; i<n) signals and sequentially inputting the divided digital signals from an LSB side;
subtracting means, connected to said input means, for subtracting a feedback signal from the digital signal input by said input means;
integrating means, connected to said subtracting means, for integrating a signal output from said subtracting means i times;
quantizing means, connected to said integrating means, for quantizing a signal output from said integrating means and generating an output signal;
delay means, connected to said quantizing means, for delaying the output signal from said quantizing means by i clocks and generating the feedback signal; and
output means, connected to said quantizing means, for outputting the output signal output from said quantizing means.

16. The modulator according to claim 15, wherein said subtracting means includes holding means for holding a carry signal and supply means for supplying the carry signal held in said holding means to said subtracting means when a next digital signal is to be calculated.

17. The modulator according to claim 15, wherein said integrating means includes adding means for adding the output signal from said delay means and the feedback signal and delay means for delaying an output signal from said adding means by i clocks to generate the feedback signal, and said adding means includes holding means for holding the carry signal and supply means for supplying the carry signal held in said holding means to said adding means when a next digital signal is to be calculated.

18. The modulator according to claim 15, wherein said input means has a plurality of input terminals for receiving a plurality of divided digital signals of a plurality of channels, and said output means has a plurality of output terminals and outputs the output signal from said quantizing means in the plurality of channels in accordance with an input order of said input means.

* * * * *